United States Patent
Hiremath et al.

(10) Patent No.: US 11,817,282 B2
(45) Date of Patent: *Nov. 14, 2023

(54) CIRCUIT BREAKERS WITH SHAPED NEUTRAL BUSBARS AND/OR LOAD TERMINALS AND RELATED METHODS

(71) Applicant: Eaton Intelligent Power Limited, Dublin (IE)

(72) Inventors: Somashekharayya Hiremath, Coraopolis, PA (US); Sandy Omar Jimenez, Monaca, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/734,882

(22) Filed: May 2, 2022

(65) Prior Publication Data
US 2022/0262590 A1    Aug. 18, 2022

Related U.S. Application Data

(62) Division of application No. 16/014,574, filed on Jun. 21, 2018, now Pat. No. 11,322,328, which is a division of application No. 15/133,676, filed on Apr. 20, 2016, now Pat. No. 10,032,590.

(51) Int. Cl.
| | | |
|---|---|---|
| *H01H 71/02* | (2006.01) | |
| *H01H 83/14* | (2006.01) | |
| *H01F 38/20* | (2006.01) | |
| *H01H 69/00* | (2006.01) | |
| *H05K 5/00* | (2006.01) | |
| *H01H 83/22* | (2006.01) | |
| *H01H 83/20* | (2006.01) | |
| *H01H 23/00* | (2006.01) | |

(52) U.S. Cl.
CPC ............. *H01H 71/02* (2013.01); *H01F 38/20* (2013.01); *H01H 69/00* (2013.01); *H01H 83/144* (2013.01); *H05K 5/0026* (2013.01); *H01H 23/006* (2013.01); *H01H 83/226* (2013.01); *H01H 2083/148* (2013.01); *H01H 2083/201* (2013.01)

(58) Field of Classification Search
CPC ...................... H01H 2083/201; H01H 23/006
USPC ........................................................ 335/18
See application file for complete search history.

(56) References Cited

U.S. PATENT DOCUMENTS

| | | |
|---|---|---|
| 3,922,586 A | 11/1975 | Buxton et al. |
| 4,507,709 A | 3/1985 | Morris et al. |
| 4,667,263 A | 5/1987 | Morris et al. |

(Continued)

*Primary Examiner* — Alexander Talpalatski
(74) *Attorney, Agent, or Firm* — Eckert Seamans Cherin & Mellott, LLC

(57) ABSTRACT

Arc Fault Circuit Interrupter (AFCI), Ground Fault Circuit Interrupter (GFCI) or AF/GF circuit breakers which may optionally have relatively small or compact bodies that have shaped neutral busbars and/or load terminals with an arm that extends through a window of a current transformer in a circuit breaker housing. The neutral busbar and/or load terminal can have a rigid or semi-rigid shaped body with a first segment that extends through the window of the current transformer and a second segment that extends behind the first segment about a printed circuit board. A plug-on, pigtail or bolt-on neutral can engage an electrical pad of the neutral busbar.

7 Claims, 12 Drawing Sheets

(56) References Cited

U.S. PATENT DOCUMENTS

| | | | |
|---|---|---|---|
| 5,179,491 A | 1/1993 | Runyan | |
| 5,291,165 A * | 3/1994 | Whipple | H01H 83/144 361/637 |
| 5,293,142 A * | 3/1994 | Fello | H01H 83/144 361/42 |
| 5,446,431 A * | 8/1995 | Leach | H01H 71/0214 335/18 |
| 5,483,211 A | 1/1996 | Carrodus et al. | |
| 6,232,857 B1 * | 5/2001 | Mason, Jr. | H01H 83/144 335/35 |
| 6,239,962 B1 * | 5/2001 | Seymour | H01H 83/226 361/115 |
| 6,259,340 B1 * | 7/2001 | Fuhr | H01H 83/04 361/42 |
| 6,482,048 B1 * | 11/2002 | Fleege | G01R 31/52 439/814 |
| 6,545,574 B1 * | 4/2003 | Seymour | H01H 71/0271 335/18 |
| 6,591,482 B1 * | 7/2003 | Fleege | H02H 1/0015 29/605 |
| 7,623,330 B2 | 11/2009 | Gallas et al. | |
| 7,898,779 B2 | 3/2011 | Weeks et al. | |
| 8,134,428 B2 * | 3/2012 | Watford | H01H 71/123 335/106 |
| 2001/0015011 A1 * | 8/2001 | Glabau | H01H 71/08 29/867 |
| 2002/0154488 A1 | 10/2002 | Leopold et al. | |
| 2002/0171987 A1 * | 11/2002 | Dudhwala | H01H 71/123 361/115 |
| 2006/0044086 A1 * | 3/2006 | Wang | H01H 83/04 335/18 |
| 2008/0024252 A1 * | 1/2008 | Gallas | H01H 83/144 361/42 |
| 2013/0278361 A1 * | 10/2013 | Weeks | H05K 5/0221 335/6 |

* cited by examiner

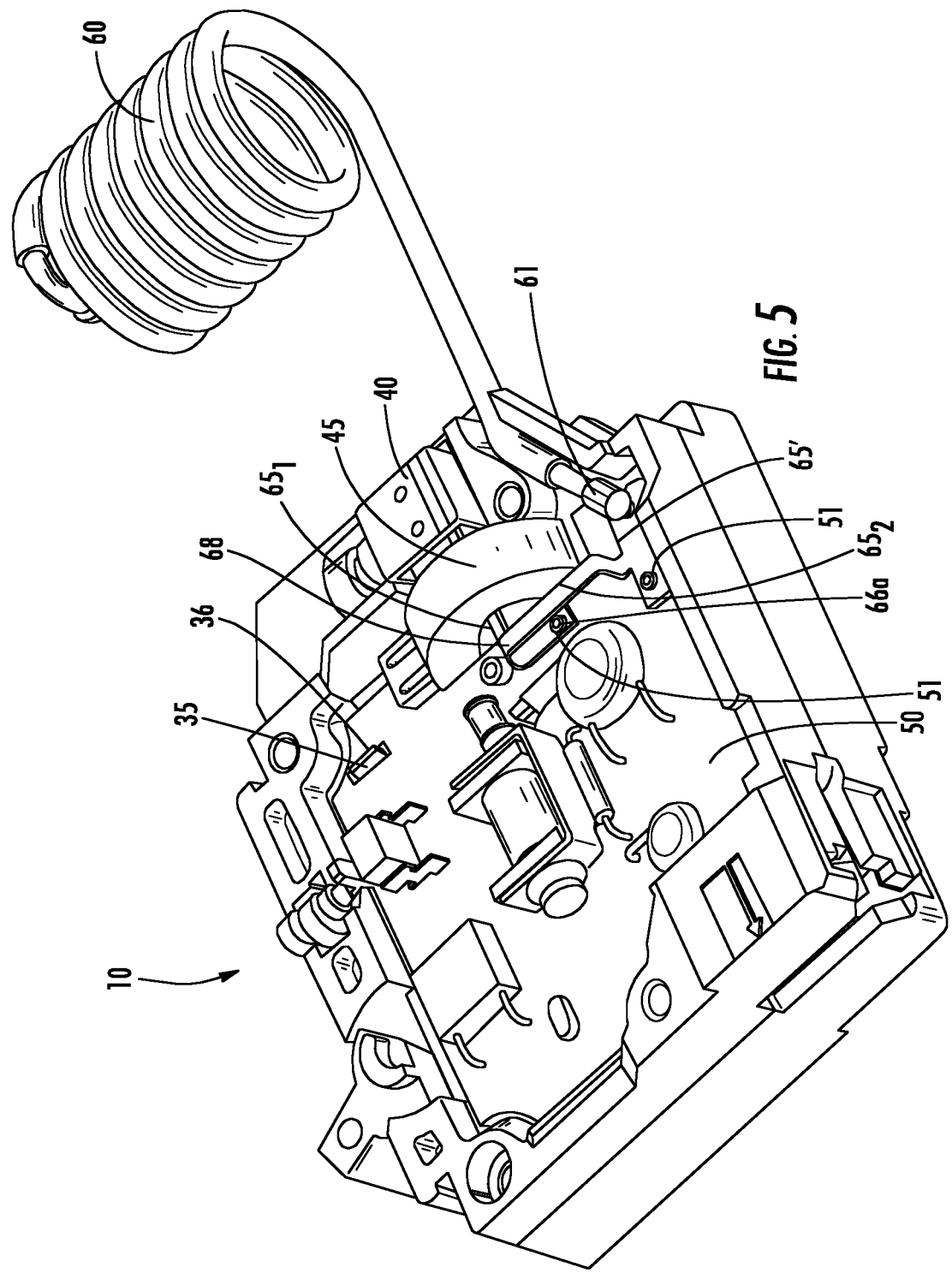

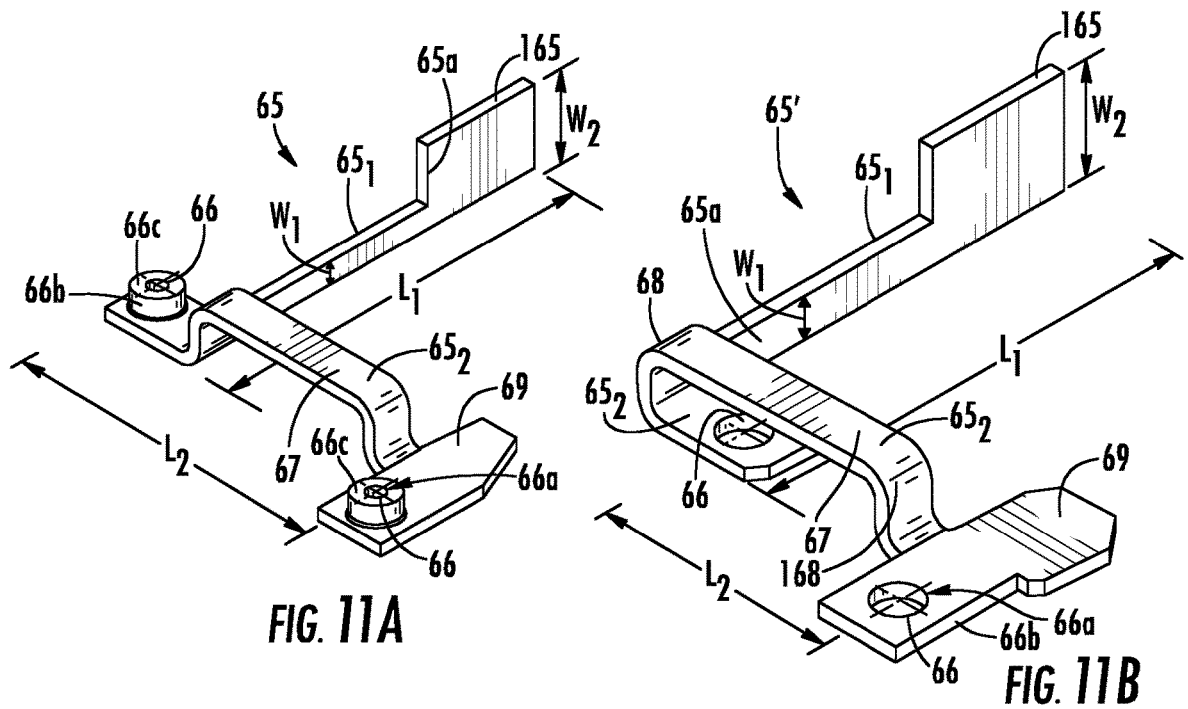
FIG. 11A
FIG. 11B
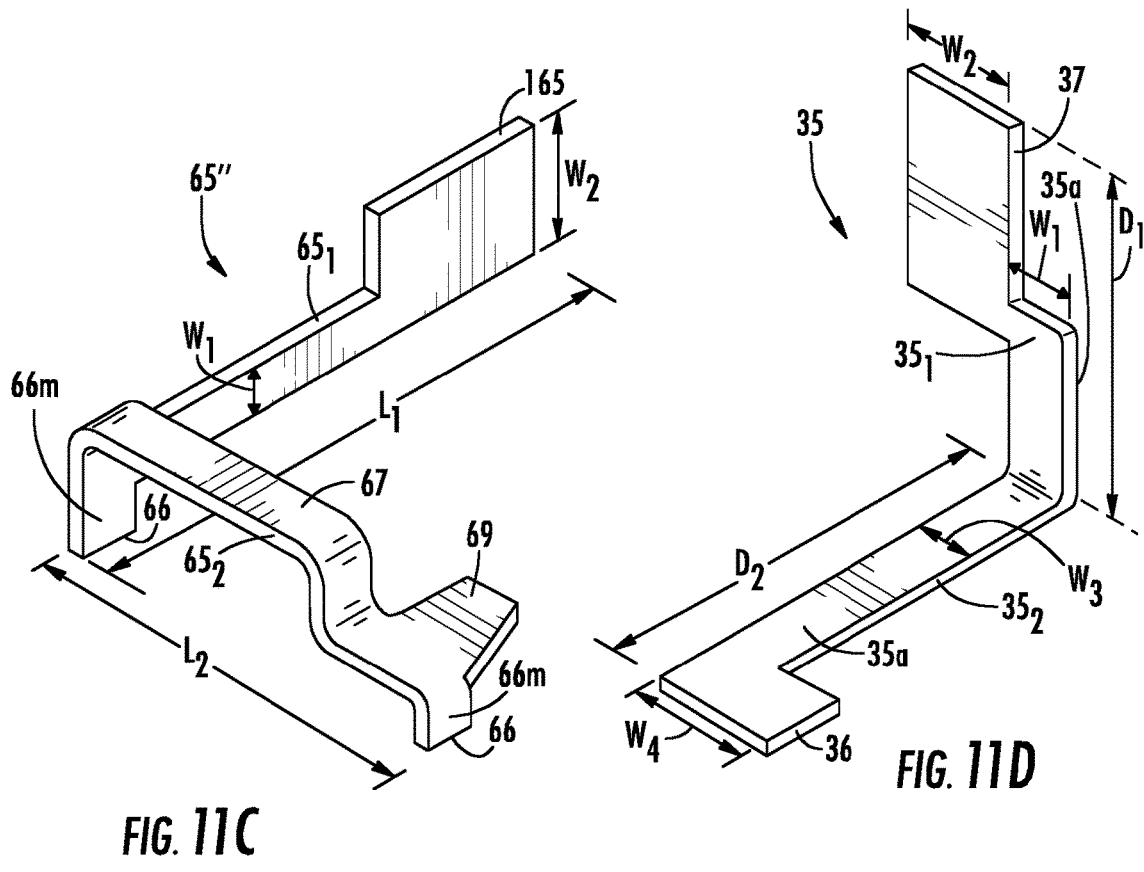
FIG. 11C
FIG. 11D

CIRCUIT BREAKERS WITH SHAPED NEUTRAL BUSBARS AND/OR LOAD TERMINALS AND RELATED METHODS

RELATED APPLICATIONS

This application is a divisional application of U.S. patent application Ser. No. 16/014,574, filed Jun. 21, 2018, which is a divisional application of U.S. patent application Ser. No. 15/133,676, filed Apr. 20, 2016, now U.S. Pat. No. 10,032, 590, issued Jul. 24, 2018, the contents of which are hereby incorporated by reference as if recited in full herein.

FIELD OF THE INVENTION

The present invention relates to branch breakers and may be particularly suitable for Arc Fault (AF) circuit interrupters (CI), Ground Fault (GF) CI and AF/GF circuit breakers.

BACKGROUND OF THE INVENTION

Arc Fault Circuit Interrupters (AFCI) and Ground Fault Circuit Interrupters (GFCI) are among a variety of overcurrent protection devices used for circuit protection and isolation. Arc Fault Circuit Interrupters (AFCIs) reduce fire hazards in electrical circuits by reducing the effects of high current arcing faults as well as detecting persistent low-current arcing faults. Ground Fault Circuit Interrupters reduce the potential of electrical shock. AFCI/GFCI breakers are available as a plug-on branch feeder or combination type breakers from Eaton Corporation. Both branch feeder and combination AFCIs provide conventional thermal and magnetic overcurrent protection. Both also provide high current or "parallel" arcing fault detection and fire mitigation for installed wiring and connected cords. National Electrical Code (NEC) revisions have increased the requirement for sections of the home that require Arc Fault or Ground Fault protection.

SUMMARY OF EMBODIMENTS OF THE INVENTION

Embodiments of the invention provide a GFCI, AFCI or AF/GF CI with a compact, shaped neutral bus bar and/or load terminal configuration that can reduce the number of welds and/or decrease assembly time and/or costs using shaped neutral busbar configurations that can be connected to connectors on a printed circuit board.

Embodiments of the invention are directed to Arc Fault Circuit Interrupter (AFCI) circuit breakers, Ground Fault Circuit Interrupters (GFCI) and/or AF/GF circuit breakers.

Embodiments of the invention are directed to circuit breakers. The circuit breakers include: a circuit breaker housing; a current transformer in the housing, the current transformer having a window; a printed circuit board (PCB) in the housing; and a neutral busbar in the housing, The neutral busbar has a rigid or semi-rigid shaped body with a first segment that extends through the window of the current transformer and a second segment that extends behind the first segment and is attached to the PCB.

The neutral busbar second segment can have connectors/connector features that directly engage mating connectors/connector features on the PCB to electrically connect and fixedly attach the neutral busbar to the PCB without requiring welding.

The first segment of the neutral busbar can be orthogonal to the second segment.

The neutral busbar can have a unitary, monolithic shaped body.

The first segment of the neutral busbar can have a straight planar arm with a first width that merges into an outer free end with a second greater width.

The second segment of the neutral busbar can have first and second laterally spaced apart apertures that receive male connections/connection features in the PCB.

The second segment of the neutral busbar can have connector/connector features that engage respective connectors/connector features of the PCB.

The circuit breaker housing can include a bottom base with a curved cavity that holds the current transformer adjacent a load side of the circuit breaker housing. The curved cavity can optionally have a radius of curvature that corresponds to a radius of an outer wall of the current transformer.

The first segment can have a planar arm with a primary surface that is orthogonal to a plane of a primary surface of the PCB. The arm can have a first width that merges into an end portion with a second width that is greater than the first width. The second segment can have a straight bridging arm that resides above female and/or male PCB connection/connector features of the second segment.

The second segment can have a planar pad that is parallel to a plane of a primary surface of the PCB and that resides closer to a front of the housing at a load side of the circuit breaker than a planar laterally extending arm of the second segment.

The first segment can have a planar arm that has a primary surface that is orthogonal to a plane of a primary surface of the PCB.

The circuit breaker can include a load terminal that can have a rigid or semi-rigid shaped body with a first segment that extends through the current transformer window and a second segment that extends internal to the housing.

The second segment of the load terminal can be orthogonal to the first segment and can have an arm with a first width merging into an internal end that can have a greater width.

The first segment of the load terminal can have a first width that merges into an outer end with a second width that is greater than the first width. The second segment of the load terminal can have a first more narrow width that merges into an internal end portion that can have a greater width. The first and second segments can have a constant thickness.

Other embodiments are directed to circuit breakers that include a circuit breaker housing; a current transformer in the housing, the current transformer comprising a window extending therethrough; a printed circuit board (PCB) in the housing; and a load terminal in the housing. The load terminal has a shaped body with a first segment that extends through the window of the current transformer and a second segment that laterally extends behind the first segment to attach to a shunt that connects to a trip mechanism in the housing.

The second segment of the load terminal can be orthogonal to the first segment and can have an internal end portion thereof that connects to the PCB optionally via a connector held by the PCB.

The first segment of the load terminal can have a first width that merges into an outer end with a second width that is greater than the first width. The second segment of the load terminal can have a first more narrow width that merges into an internal end portion with a greater width.

The load terminal can be a unitary monolithic shaped member.

The first and second segments can have a constant thickness.

The first segment of the load terminal can have a straight planar arm with a first width that merges into an outwardly facing end that can have a second greater width.

The circuit breaker can be a one inch and/or ¾ inch residential type circuit breaker and/or a Type BR or Type CH circuit breaker.

The circuit breaker can include a neutral busbar in the housing. The neutral busbar can have a rigid or semi-rigid shaped body with a first segment that extends through the window of the current transformer and a second segment that extends behind the first segment. The second segment may be orthogonal to the first segment and can be directly or indirectly attached to the PCB.

The neutral busbar second segment can have connectors/connector features that directly engage mating connectors/connector features on the PCB to electrically connect and fixedly attach the neutral busbar to the PCB without requiring welding.

Other embodiments are directed to methods of fabricating an Arc Fault Circuit Interrupter (AFCI) and/or a Ground Fault Circuit Interrupter (GFCI) circuit breaker. The methods include: providing a circuit breaker printed circuit board (PCB) with on-board neutral busbar connectors; and providing a neutral busbar having a pre-formed and self-supporting shape. The neutral busbar has a first segment that extends in a first direction and merges into a second segment that is orthogonal to the first segment, the second segment having spaced apart first and second PCB connectors/connection features. The method further includes positioning the neutral busbar so that the second segment of the neutral busbar connector/connector features align with electrical connectors/connection features on the PCB and so that the first segment extends through a current transformer; and then pressing against the neutral busbar to attach the neutral busbar to the aligned connectors/connection features of the PCB without requiring any welding.

The method can also optionally include, providing a load terminal having a pre-formed and self-supporting shape. The load terminal can have a first segment that extends in a first direction and merges into a second segment that is orthogonal to the first segment. The method can include, optionally before or after the aligning and pressing, placing the load terminal so that an inner end extends into a connector on/in the PCB and the outer end extends through the current transformer.

The method can include providing a bottom base of a circuit breaker housing with a curved cavity and placing a current transformer in the curved cavity and rotating the current transformer while held in the curved cavity to alter an orientation of the window before or during the positioning of the neutral busbar.

The circuit breaker can be a one inch and/or ¾ inch residential type circuit breaker and/or a Type BR or Type CH circuit breaker.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 5 is a side perspective view of another embodiment of a circuit breaker, shown in a partially assembled view without the top cover, according to embodiments of the present invention.

FIGS. 11A-11C are enlarged side perspective views of exemplary neutral busbar configurations according to embodiments of the present invention.

FIG. 11D is an isometric view of an exemplary load terminal according to embodiments of the present invention.

Figure 1:
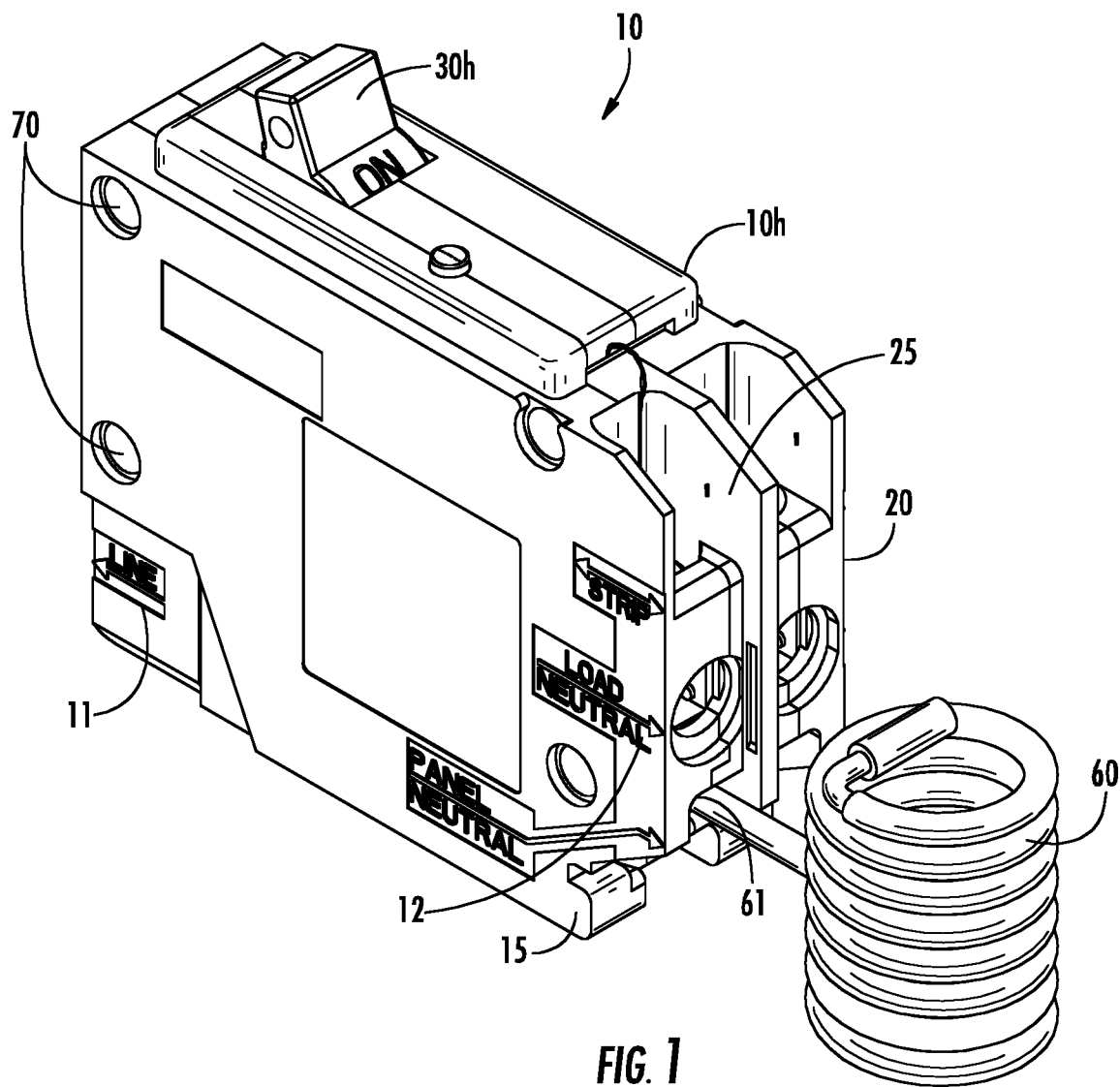
FIG. 1 is an enlarged side perspective view of a circuit breaker according to embodiments of the present invention.

Other features of the present invention will be more readily understood from the following detailed description of exemplary embodiments thereof when read in conjunction with the accompanying drawings, wherein like references numerals represent like elements. The drawings are merely exemplary to illustrate certain features that may be used singularly or in combination with other features and the present invention should not be limited to the embodiments shown. Features shown with respect to one embodiment or figure may be used with other embodiments or figures. The terms "FIG." and "Fig." are used interchangeably as abbreviations of the word "Figure" in the drawings and specification.

DETAILED DESCRIPTION OF EMBODIMENTS OF THE INVENTION

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 65, 65', 65". 65"').

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 2:
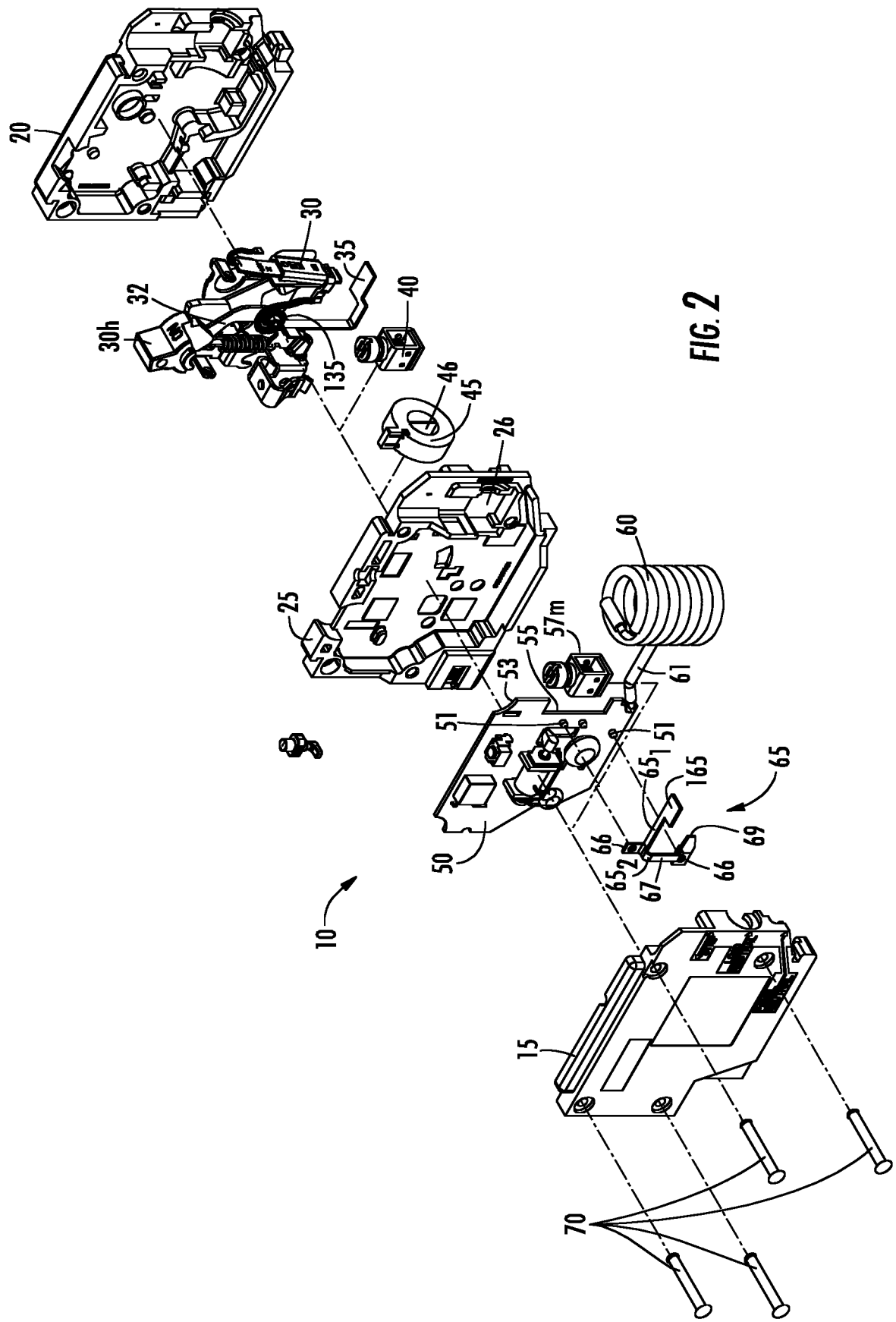
FIG. 2 is an exploded view of the circuit breaker shown in FIG. 1 according to embodiments of the present invention.
Figure 3:
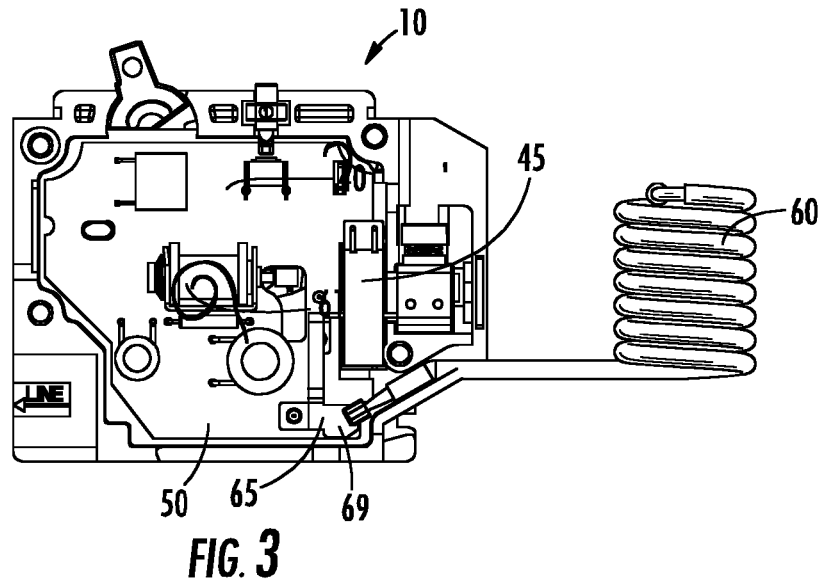
FIG. 3 is a side view of a circuit breaker, such as that shown in FIGS. 1 and 2, illustrated without the top cover according to embodiments of the present invention.

Turning now to the figures, FIGS. 1-3 illustrate an example of a circuit breaker 10. As shown, the breaker 10 can optionally include an external coiled "pigtail" neutral, a plug-on neutral and/or a bolt on neutral 60 with an internally located end portion 61.

In some embodiments, a neutral clip assembly can be used as an alternative to the pigtail conductor 60 of breakers to connect neutral or ground bars.

The breaker 10 includes a housing 10*h* which can include a top cover 15, a bottom cover 20 and an intermediate or "middle" base 25. The breaker 10 has a line side 11 and a neutral/load side 12. The breaker 10 holds a trip mechanism 30 with an operator handle 30*h*.

Rivets 70 or other attachment members can connect the top cover, bottom cover and base 15, 20, 25 to enclose a printed circuit board (PCB) 50 and the trip mechanism 30 with a moving contact arm 32, as is well known to those of skill in the art.

As shown in FIGS. 2, 3, 4 and 8, for example, the circuit breaker 10 can include at least one neutral busbar 65 with spaced apart connectors and/or connector features 66 that attach to a printed circuit board (PCB) with aligned electrical features or connectors 51. Although shown as using only two connector/connection features more may be used.

The breaker 10 can also include a collar assembly 40 and a current transformer 45 (which may be a single transformer) with at least one window 46 extending therethrough. The middle base 25 and the PCB 50 can include a cutout, perimeter contour and/or window 26, 55, respectively, that allow part of the current transformer 45 to extend therethrough so that the at least one window 46 spans both sides of the of the primary surfaces of the middle base 25 and the PCB 50, i.e., so that an arcuate portion of the current transformer extends above the primary surface of the PCB with the neutral busbar connectors or connector features 51. The current transformer 45 can reside on the load side 12 and can extend through the window 26 in the middle base 25 (FIG. 2), adjacent and behind (more internal) to the breaker 10 than the collar assembly 40.

The neutral busbar 65 can have a three-dimensional conductive body with a defined self-supporting 3-D shape. The neutral busbar 65 can be provided as a plurality of cooperating members (not shown) or may be provided as a unitary, monolithic body such as stamped or otherwise formed sheet metal body. The neutral busbar 65 can be rigid or semi-rigid. The term "semi-rigid" means that the member has sufficient structural rigidity to retain its formed shape but can flex when exposed to defined forces.

The neutral busbar 65 can allow for "plug-in", "press-fit" or even threaded attachment connections to connect/attach the neutral busbar 65 to the PCB 50 without requiring welding before the line side 11. The connections 51, 66 can be provided without using loose lengths of wiring with a connection interface comprising connection features/connectors such as male, female or male and female connections 51 on the PCB 50 and counterpart connections/connectors 66 on the neutral busbar 65. The connections 51/66 can avoid any loose wiring, splicing or welding attachments while still providing a suitable electrical connection and a fixed attachment position.

The breaker 10 also includes a load terminal 35 that can optionally also have a self-supporting shape with a rigid or semi-rigid body as will be discussed further below. The load terminal 35 can attach to the breaker trip mechanism 30 via a wire 135. The load terminal and neutral busbar 35, 65 can reside within a relatively compact, i.e., within less than two inches, such as within less than about a 1 inch wide footprint, but other sizes and configurations may be used. In some embodiments, the configuration may allow for increased current transfer relative to conventional configurations even with optional compact footprints.

Figure 4:
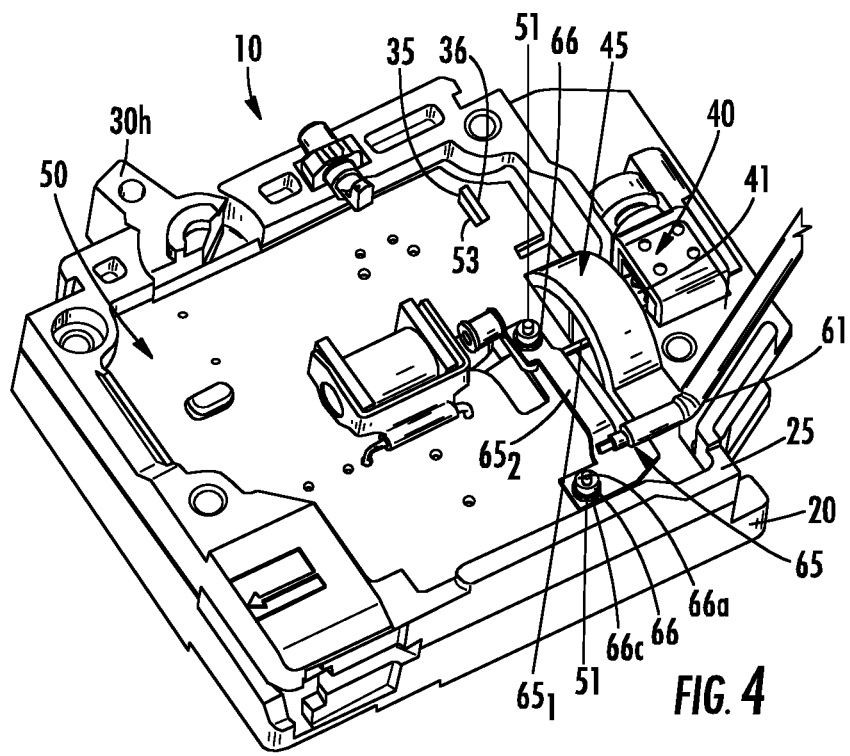
FIG. 4 is a side perspective view of the circuit breaker shown in FIG. 2 in a partially assembled configuration (without the top cover) according to embodiments of the present invention.

As shown in FIGS. 2, 3, 4 and 8, for example, the neutral busbar 65 can have a first segment $65_1$ with an outwardly facing end 165. The first segment $65_1$ can have a length sufficient to extend through the window 46 of the current transformer 45 and into the collar assembly 40 to position the outer facing end 165 external of the current transformer 45 (FIGS. 4A, 4B, for example). The current transformer window 46 can comprise a cylindrical or semi-cylindrical channel aligned with a rectangular channel 41 of the collar assembly 40. The outwardly facing end 165 can reside adjacent one side of the channel 41 (FIG. 4).

The first segment $65_1$ of the neutral busbar 65 can be straight and planar.

The first segment $65_1$ can have a planar wall with a primary surface that is orthogonal to the plane of the primary surface of the PCB 50.

The second segment $65_2$ of the neutral busbar 65 can be orthogonal to the first segment $65_1$.

The neutral busbar 65 can have a planar or shaped foot pad 69 with an upper surface that can engage a leading (internal) end of the neutral 61. The foot pad 69 can be a longitudinally extending extension of the second segment $65_2$ and can be held parallel to the plane of the primary surface of the PCB 50 and/or orthogonal to the primary surface of the wall of the first segment $65_1$.

The second segment $65_2$ of the neutral busbar can have a bridging arm 67 that extends between the connectors/connector features 66. The bridging arm 67 can rise from the connectors/connector features 66 to a height above the connectors/connector features 66.

Figure 8:
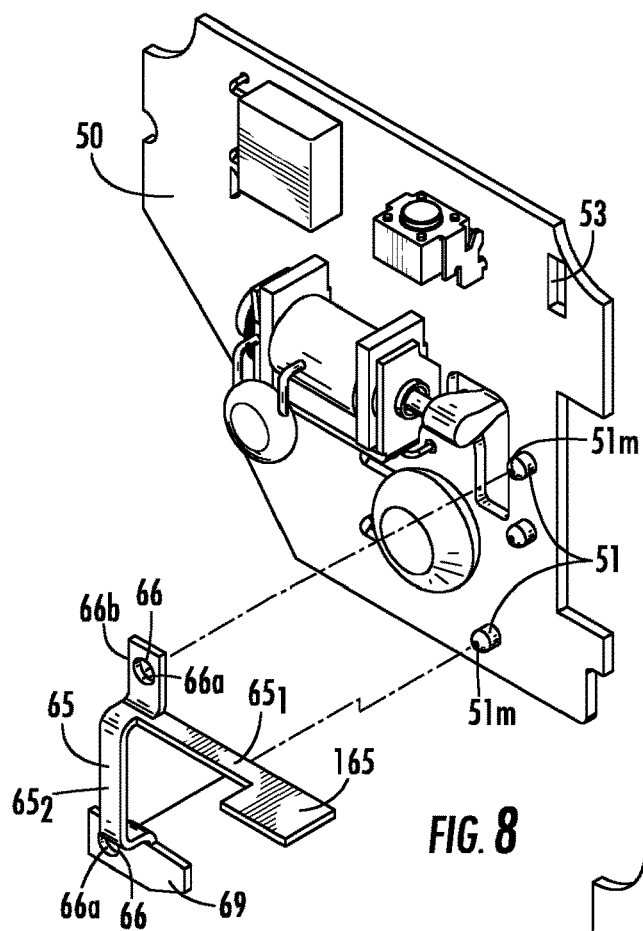
FIG. 8 is an exploded view of an exemplary neutral busbar and PCB with aligned connectors according to embodiments of the present invention.

As shown in FIG. 4, the neutral busbar connections/connector features 66 can comprise projecting members 66c that can be cylindrical members that rise a short distance above a planar base 66b of the second segment $65_2$. The cylindrical members 66c comprise respective cylindrical channels providing the apertures 66a that receive the male connectors/connection features 51m on the PCB 50. However, as shown in FIG. 8, for example, the apertures 66a can be provided through only the base 66b without requiring the projecting members 66c. The projecting members 66c may provide an increased electrical contact surface area.

Centerlines of the neutral busbar connections/connector features 66, such as apertures 66a, can be laterally and longitudinally offset from each other, typically so that the connector/connection feature 66 closer to the current transformer window 46 is more forward than the other.

Figure 9:
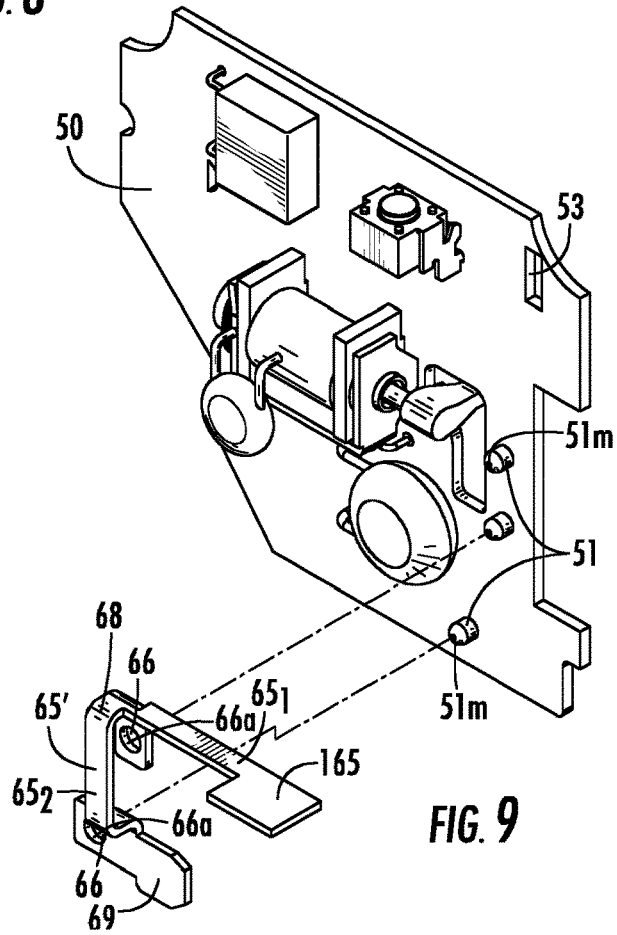
FIG. 9 is an exploded view of another exemplary busbar and PCB with aligned connectors according to embodiments of the present invention.
Figure 10:
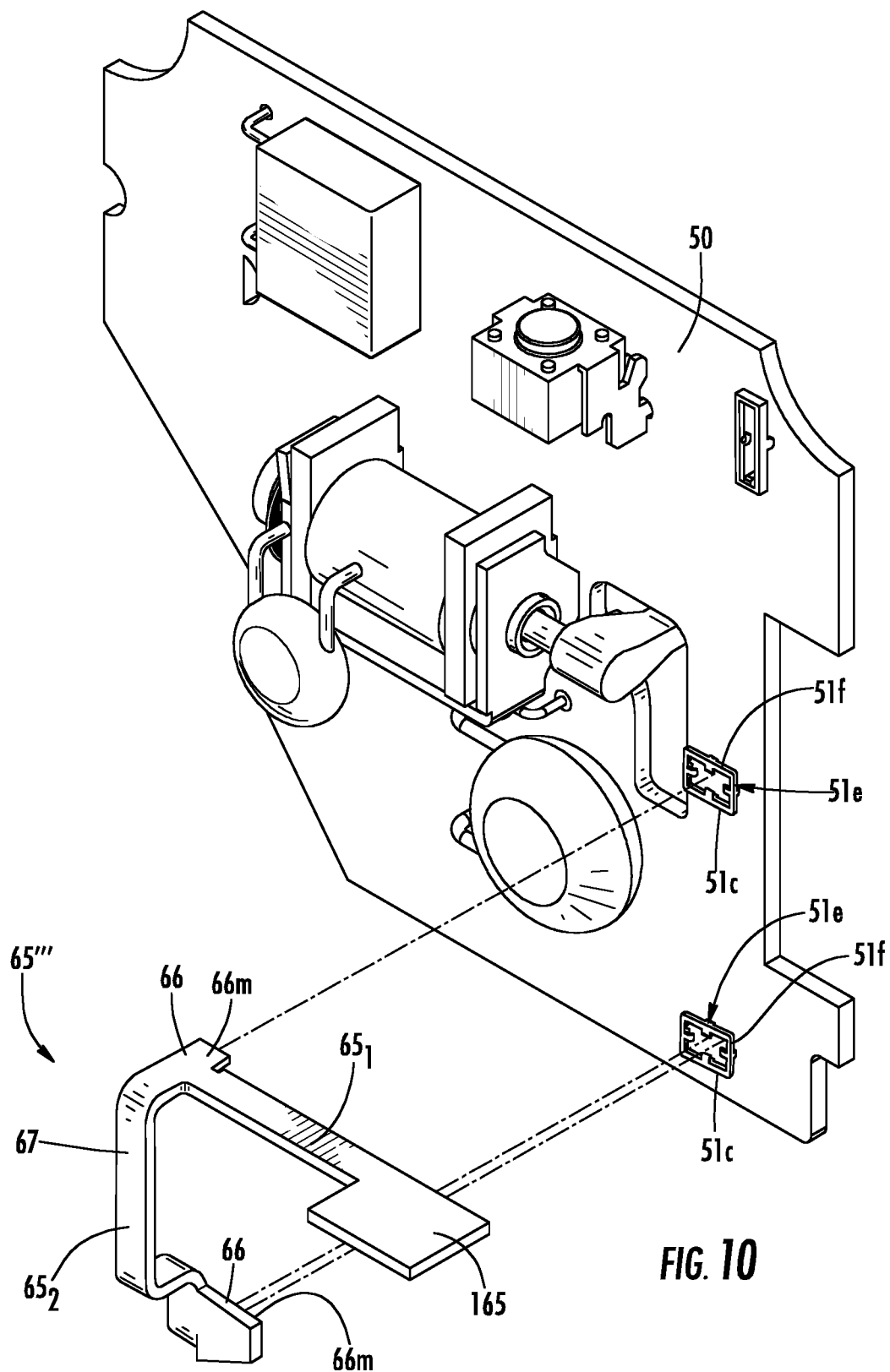
FIG. 10 is an exploded view of yet another exemplary busbar and PCB with aligned connectors according to embodiments of the present invention.

FIGS. 5 and 9 illustrate a second embodiment of a neutral busbar 65'. In this embodiment, the second segment $65_2$ has a U-shaped end segment 68 with the legs of the "U" oriented to be parallel to the plane of the primary surface of the PCB 50, one leg extending above another and the lower leg comprising one of the apertures 66a. The "U" shaped first end 68 can reside adjacent the current transformer 45 and the top leg of the U can merge the bridging arm 67 which can have a planar upper surface that extends to merge into a sloped second end 168 (FIG. 11B).

FIGS. 2, 3, 4, 5, 8 and 9 illustrate that the PCB 50 can have male connectors 51m such as pins that extend into aligned connectors 66 comprising apertures 66a in the neutral bus bar 65, 65'.

Figure 6A:
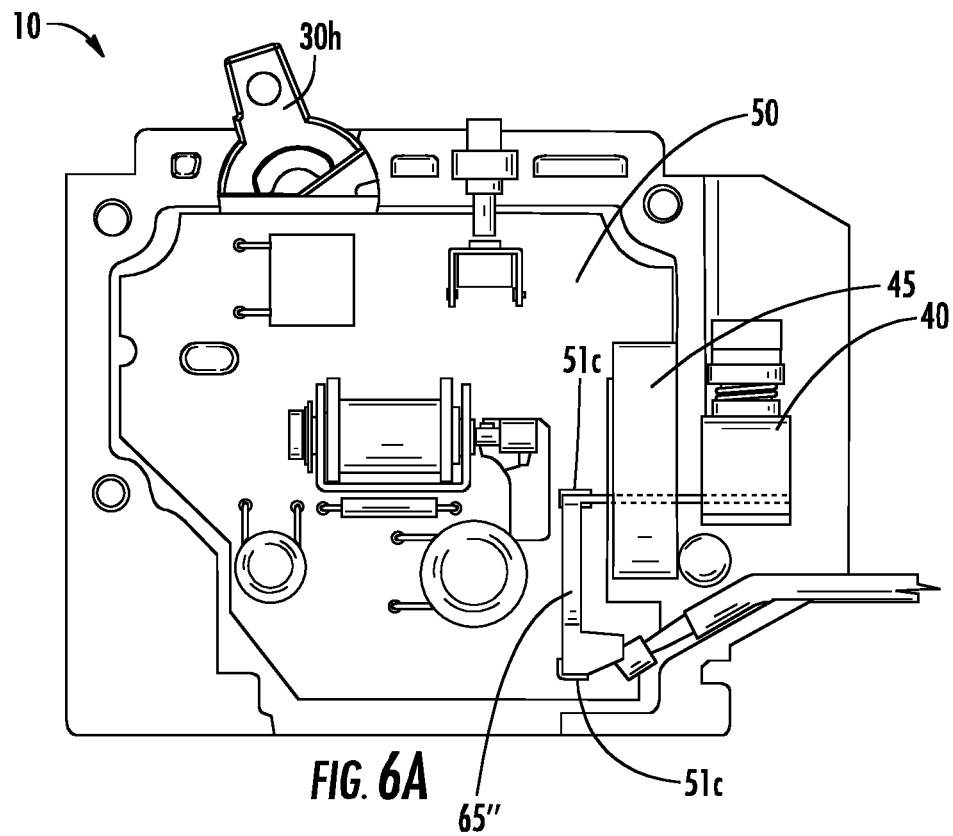
FIG. 6A is a side view of another embodiment of a circuit breaker, shown in a partially assembled view without the top cover, according to embodiments of the present invention.
Figure 6B:
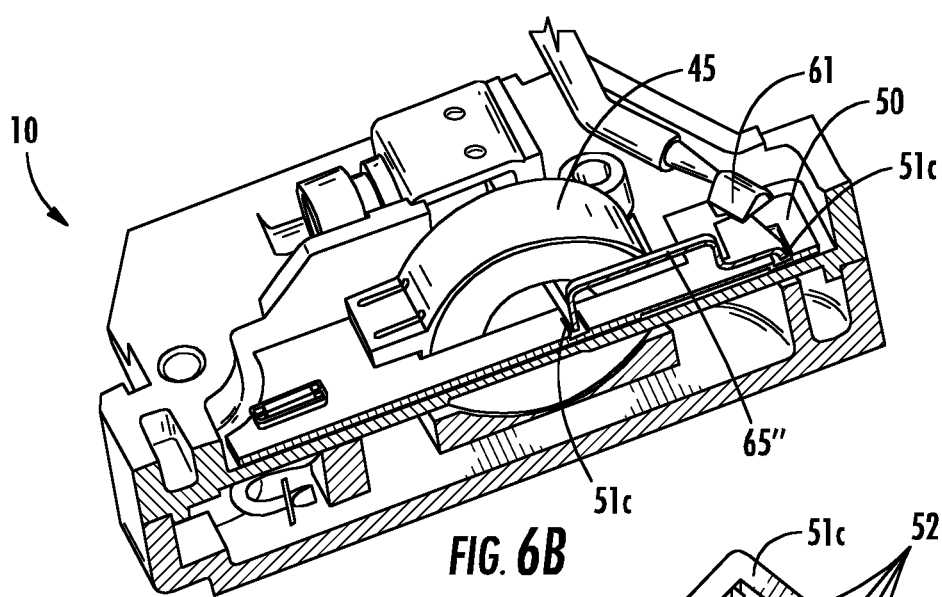
FIG. 6B is a partial section view of the partially assembled device shown in FIG. 6A.
Figure 6C:
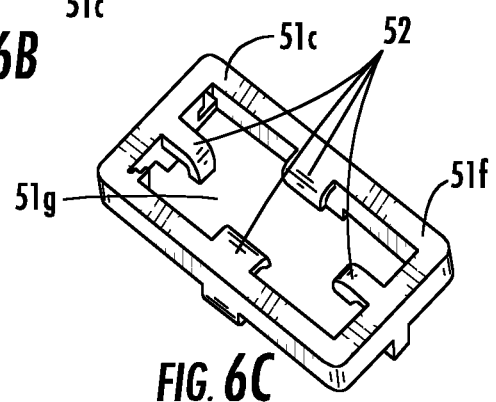
FIG. 6C is an enlarged top, perspective view of an exemplary connector for connecting the bus bar to the PCB according to embodiments of the present invention.

FIGS. 6A-6C illustrate another embodiment of the neutral busbar 65" where one (or both) the connectors/connection features 66 have a male configuration 66m of connectors/connection features and the PCB 50 has female connectors/connection features 51c/51f. As shown in FIG. 6C, for example, the female connector 51f can have inwardly extending members 52 that are spaced apart about a perimeter facing over a center gap 51g to facilitate a tight engagement of the neutral busbar connectors/connection features 66. However, other connector/connection features and configurations may be used as will be known by those of skill in the art.

FIGS. 6A-6C and 11C and FIG. 10 shows that the neutral busbars 65", 65''', respectively, have male connector features 66m which engage female connections 51f provided as connectors 51c on the PCB 50.

Although not shown, the neutral busbar 65, 65', 65", 65''' can include one male and one female connector/connection feature to connect with the PCB 50.

Figure 7:
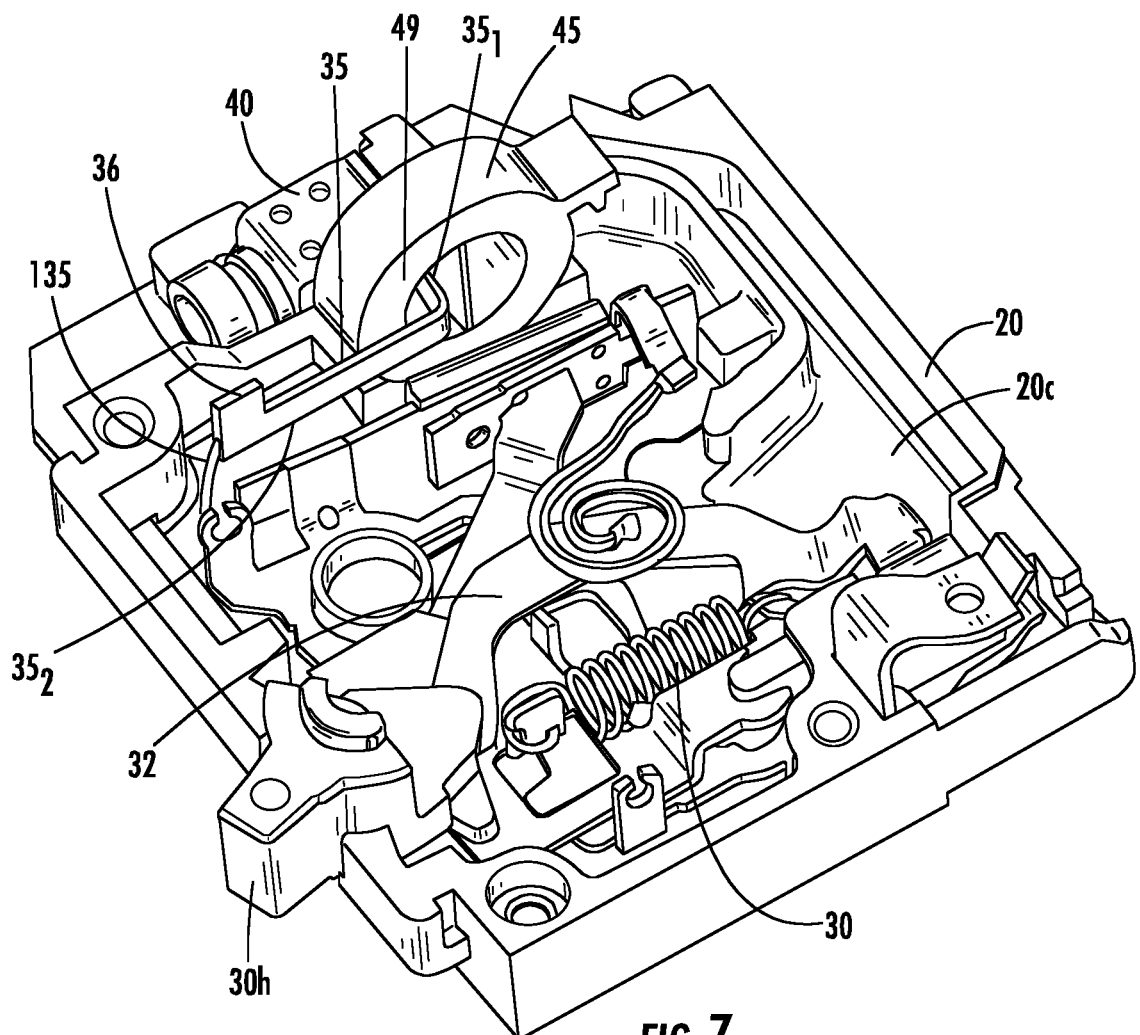
FIG. 7 is a side perspective view of a partially assembled circuit breaker, such as that shown in FIGS. 1 and 2, but omitting the PCB and top cover for ease of illustration of certain internal components according to embodiments of the present invention.

FIG. 7 illustrates that the circuit breaker 10 may also include shaped load terminal 35 with a self-supporting rigid or semi-rigid body. The load terminal 35 can have a first elongate segment $35_1$ that is orthogonal to a second elongate segment $35_2$. The second segment $35_2$ can have an internal end 36 that can engage the PCB 50, typically extending through an aperture 53 in the PCB 50 as shown, for example in FIG. 4. The end of the load terminal 36 can be attached to a wire 135 which connects to the trip mechanism 30.

The first segment of the load terminal $35_1$ can extend straight through the current transformer window 46. The second segment $35_2$ of the load terminal $35_2$ can turn to travel toward the handle 30h and reside adjacent a perimeter of an interior cavity 20c in the bottom base 20 to extend laterally a distance away from the current transformer 45, typically with a planar straight primary surface of the second segment $35_2$ residing adjacent and parallel to an outer internal wall 49 of the transformer 45 (FIG. 7).

The first segment $35_1$ can have an externally facing end 37 that extends into the channel of the collar assembly 40. The first and second segments $35_1$, $35_2$ can be planar. The load terminal 35 can be a unitary, monolithic member and may be a stamped or otherwise formed sheet metal member. In some embodiments, the load terminal 35 can comprise a plurality of cooperating members (not shown).

The load terminal 35 can allow for "plug-in", "press-fit" or even threaded attachment connections to connect/attach the end of the load terminal 36 to the PCB 50 without requiring welding. The connection can be provided without using loose lengths of wiring with a connection interface comprising connection features/connectors such as male, female or male and female connections on the PCB 50 and counterpart connections/connectors on the load terminal end 36. The connections can avoid any loose wiring, splicing or welding attachments while still providing a suitable electrical connection and a fixed attachment position. Although shown as a male load terminal attachment/engagement configuration for a female connector/aperture on or in the PCB 53, the load terminal 35 may alternatively comprise a female engagement configuration to a male PCB connector/connector feature (not shown).

Also, the shaped load terminal 35 may be used in circuit breakers 10 without requiring the neutral busbars 65, 65', 65", 65''' discussed herein, i.e., with conventional neutral wiring configurations.

Referring to FIGS. 11A-11C, the neutral busbar 65, 65', 65" can have different PCB interface connectors/connection features 66 and each can include a first segment $65_1$ with a length $L_1$ and a second segment $65_2$ with a length $L_2$. In some embodiments, $L_1 > L_2$. In some embodiments, $L_1 = L_2$. In some embodiments, $L_1 < L_2$.

The first segment $65_1$ of the neutral bus bar can have an arm 65a with a first width $W_1$ that increased to a second greater width $W_2$ at the externally facing end 165. The end 165 can have a width $W_2$. The first width $W_1$ can be less that the width of the end 165. In some optional embodiments, W1 can be about 50% or less than the width of the end 165.

The neutral bus bar 65, 65', 65", 65''' can be metallic and have a shaped body with constant thickness over the entire shaped body or at least a major portion of each of the first and second segments $65_1$, $65_2$.

Referring to FIG. 11D, the load terminal 35 can have a first segment $35_1$ with a first length $D_1$ and a second segment $35_2$ with a second length $D_2$. In some embodiments, $D_1 > D_2$. In some embodiments, $D_1 = D_2$. In some embodiments, $D_1 < D_2$.

The first segment $35_1$ of the load terminal can have an arm 35a with a first width $W_1$ that increases to a second greater width $W_2$ at the externally facing end 37. The first width $W_1$ can be less than the width of the end 37.

The second segment $3_{52}$ of the load terminal can have an arm 35a with a first width $w_3$ that increases to a second greater width $w_4$ at the internal end 36. The first width $w_3$ can be less than the width $w_4$ of the end 36. $w_1$ and $w_3$ can be the same, in some embodiments. The first and second segments $3_{51}$, $3_{52}$ of the load terminal 35 can each have the same thickness. The load terminal 35 can have a shaped body with a constant thickness over the entire or at least a major portion thereof.

Figure 12:
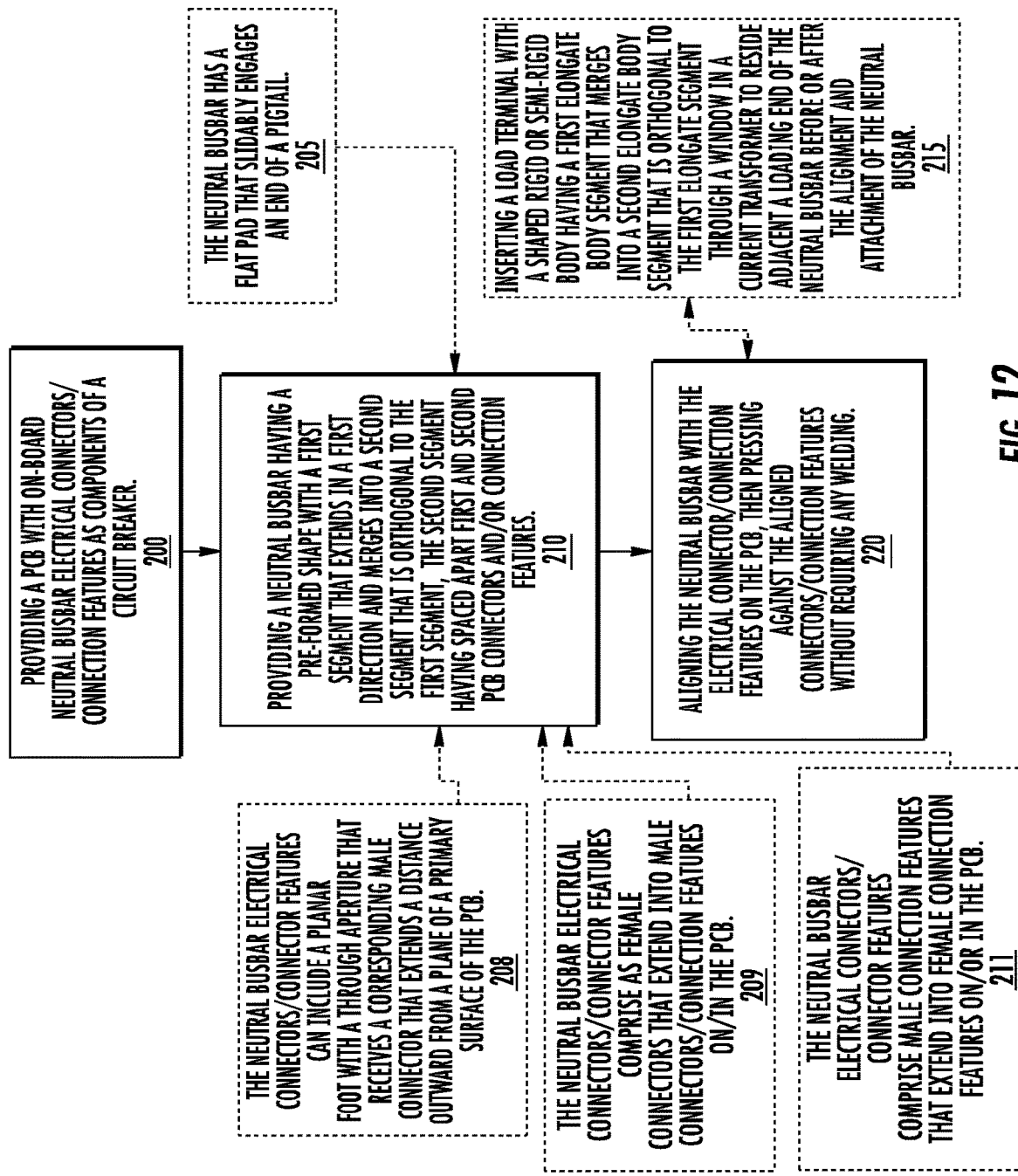
FIG. 12 is a flow chart of exemplary fabrication operations that can be used to fabricate a circuit breaker according to embodiments of the present invention.

FIG. 12 is a flow chart of exemplary fabrication operations that can be used to fabricate a circuit breaker according to embodiments of the present invention. A PCB with on-board neutral busbar connectors/connection features can be provided as components of a circuit breaker (block 200). A neutral busbar having a pre-formed (self-supporting) shape can also be provided. The neutral busbar can have a first segment that extends in a first direction and merges into a second segment that is orthogonal to the first segment, the second segment having spaced apart first and second PCB connectors/connection features (block 210). The neutral busbar connector/connector features can be aligned with electrical connectors/connection features on the PCB, and pressed together to attach the neutral busbar to the aligned connectors/connection features without requiring any welding (block 220).

The neutral busbar electrical connectors/connector features can include a planar foot with a through aperture that receives a corresponding male connector that extends a distance outward from a plane of a primary surface of the PCB (block 208).

The neutral busbar electrical connectors/connector features can include one or more female connectors that extend into aligned male connectors/connection features in the PCB (block 209).

The neutral busbar electrical connectors/connector features can include one or more male connectors that extend into aligned female connectors/connection features on and/or in the PCB (block 211).

The neutral bus bar has a flat pad that can slidably or otherwise engage an end of a neutral such as a plug-on, bolt-on or pigtail (block 205).

The method may also include inserting a load terminal with a shaped rigid or semi-rigid body having a first elongate body segment that merges into a second elongate body segment that is orthogonal to the first elongate segment through a window in a current transformer to reside adjacent a leading end of the neutral busbar before or after the alignment and attachment of the neutral busbar (block 215).

The first segment of the neutral busbar can also extend through the current transformer adjacent the load terminal and each can have free external facing ends.

The circuit breaker can be a 1 inch or ¾ inch residential AFCI or GFCI or AF/GF breaker, but it is also contemplated that the novel devices may also be suitable for other circuit breaker configurations/platforms.

The circuit breaker can be a Type BR or CH circuit breaker.

Figure 13:
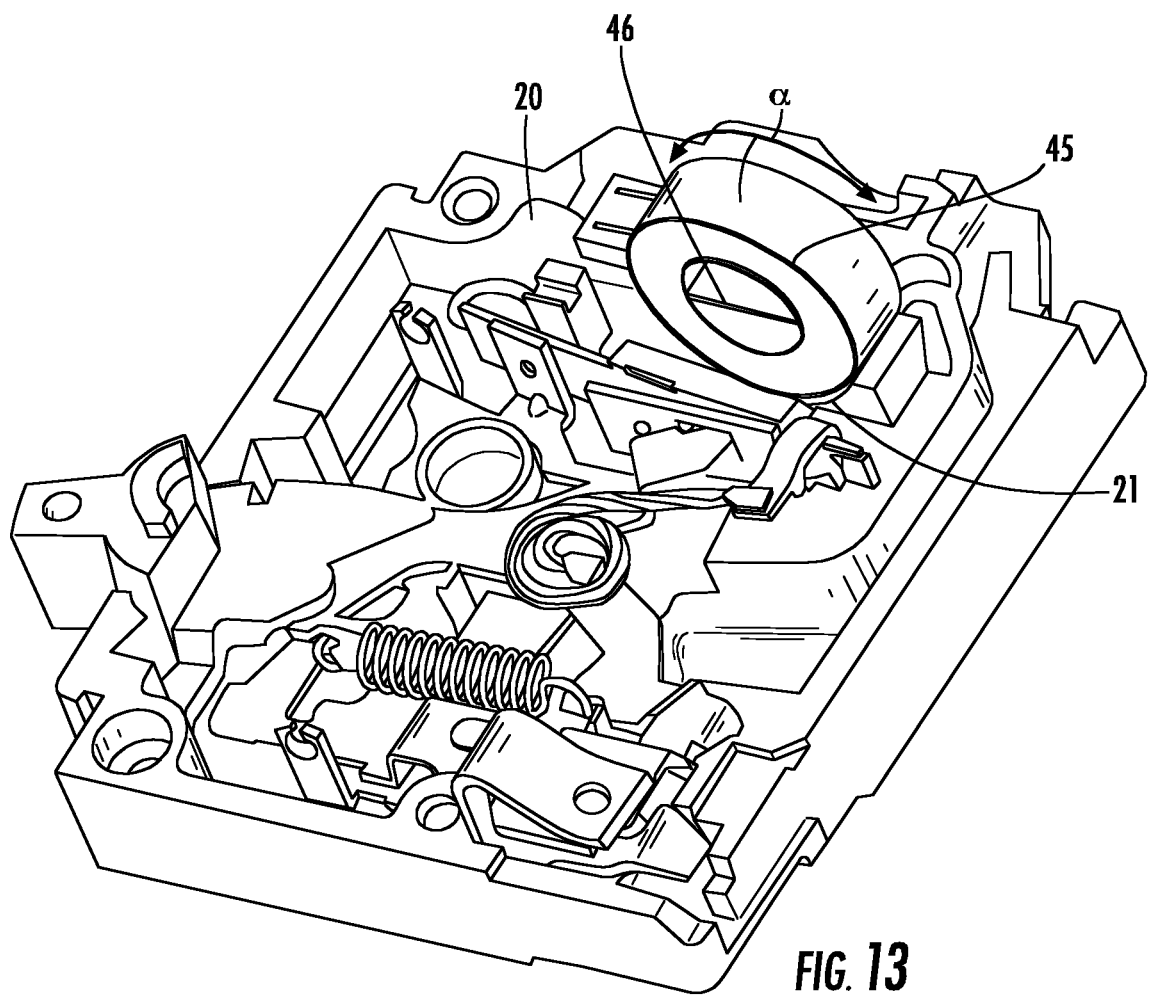
FIG. 13 is a top perspective views of a subassembly of a current transformer and an exemplary bottom base configuration allowing for rotation of the current transformer for ease of assembly according to embodiments of the present invention.
Figure 14:
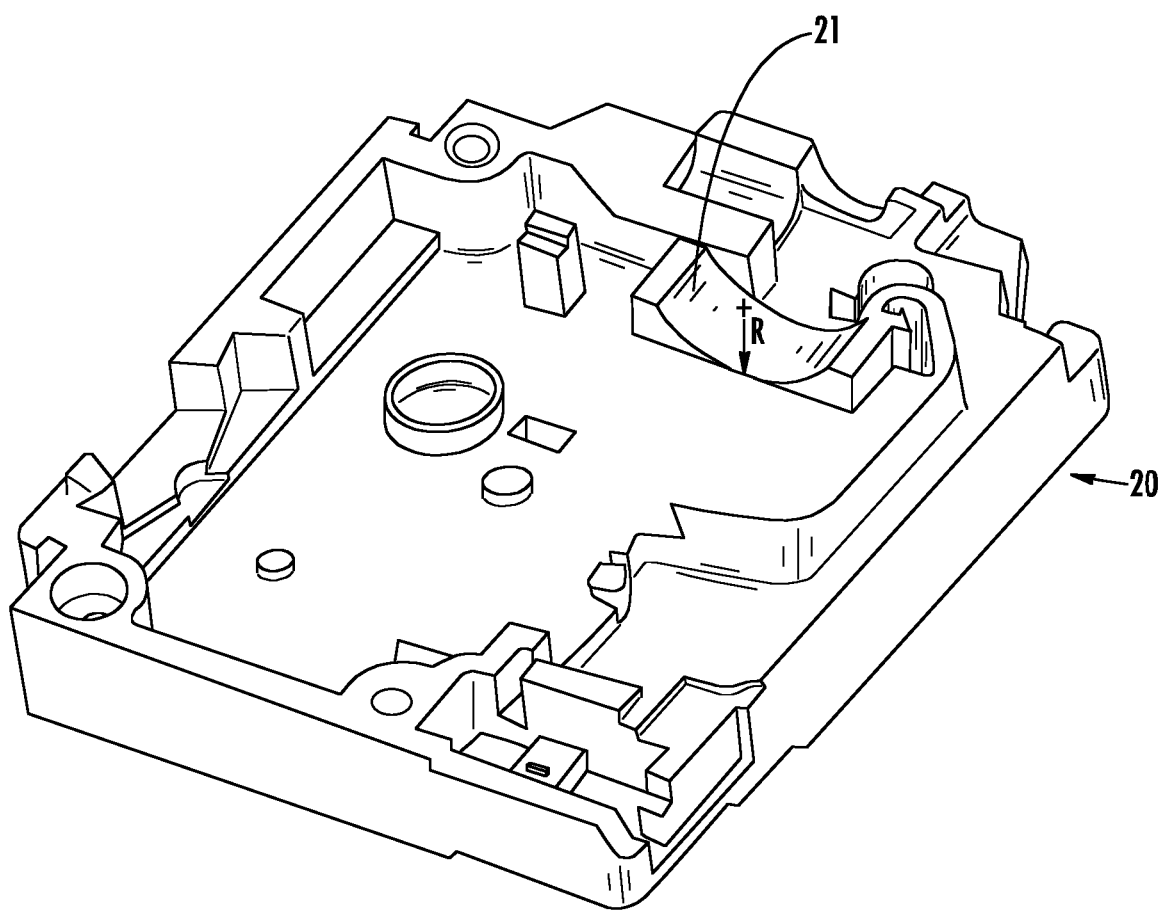
FIG. 14 is a top perspective view of the bottom base shown in FIG. 13 but illustrated without the current transformer.

FIGS. 13 and 14 illustrate that the circuit breaker 10 can have a bottom base 20 with a curved, typically arcuate, cavity 21 that holds the current transformer 45. The arcuate cavity 21 can have a radius of curvature R (FIG. 14) that corresponds to that of the radius of the outer wall of the current transformer 45 to be able to hold the current transformer 45 in position in the bottom base 20.

The arcuate cavity 21 can be integrally formed in the bottom base 20 or may be provided as a discrete component that can be attached to the bottom base 20. The arcuate cavity 21 can reside adjacent the load neutral side of bottom base 20. During assembly, the current transformer 45 can rotate side to side an angular amount "α" to be at different orientations while held in the curved cavity 21, typically by between 90-180 degrees, more typically by about 180 degrees as shown by the arrow in FIG. 13, which can facilitate assembly by allowing the load terminal and neutral bus to be passed more easily through the current transformer 45. The current transformer 45 can be rotated so that the internal baffle 46 (where used) can be oriented at different angles such as at horizontal and vertical, for example, relative to the bottom of the bottom base 20.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:
1. A circuit breaker, comprising:
a circuit breaker housing;
a current transformer in the housing, the current transformer comprising a window;
a printed circuit board (PCB) in the housing;
a neutral busbar in the housing, wherein the neutral busbar has a rigid or semi-rigid shaped body with a first segment that extends through the window of the current transformer and a second segment that extends behind the first segment and is directly attached to the PCB, and wherein the neutral busbar comprises male connector features that engage female connectors held on the PCB; and a load terminal having a rigid or semi-rigid shaped body with a first segment that extends through the window of the current transformer spaced apart from and parallel to the first segment of the neutral busbar and a second segment that extends internal to the housing, wherein the neutral busbar comprises a planar pad that resides inside the circuit breaker housing that slidably engages an end portion of a pigtail neutral, and wherein the PCB is disposed between the second segment of the neutral busbar and the second segment of the load terminal such that the PCB separates the second segment of the neutral busbar and the second segment of the load terminal.

2. The circuit breaker of claim 1, wherein the female connectors have a perimeter surrounding an open gap and spaced apart inwardly extending members that face each other across the open gap to thereby facilitate a tight connection.

3. The circuit breaker of claim 1, wherein the circuit breaker housing comprises a bottom base member with an internal facing curved cavity, a cooperating middle base member, and a cooperating top cover that attach together, wherein the middle base member holds the PCB over the bottom base member and inside the top cover, and wherein the internal facing curved cavity holds the current transformer adjacent a load side of the circuit breaker with a portion of the window above the PCB and a portion of the window below the PCB.

4. The circuit breaker of claim 1, wherein a free end of the neutral bus bar has a greater width than the first segment and at least part of the second segment.

5. The circuit breaker of claim 1, wherein the load terminal comprises at least one male connector that engages an aligned female connector held by the PCB.

6. The circuit breaker of claim 1, wherein the load terminal comprises at least one female connector that engages an aligned male connector held on the PCB.

7. The circuit breaker of claim 1, wherein connectors/connector features of the PCB and neutral busbar are plug-in and/or press-fit connectors/connector features.

* * * * *